United States Patent
Apostolos

(10) Patent No.: US 6,504,508 B2
(45) Date of Patent: Jan. 7, 2003

(54) PRINTED CIRCUIT VARIABLE IMPEDANCE TRANSMISSION LINE ANTENNA

(75) Inventor: John T. Apostolos, Merrimack, NH (US)

(73) Assignee: BAE Systems Information and Electronic Systems Integration INC, Nashua, NH (US)

( * ) Notice: Subject to any disclaimer, the term of this patent is extended or adjusted under 35 U.S.C. 154(b) by 0 days.

(21) Appl. No.: 09/849,744

(22) Filed: May 4, 2001

(65) Prior Publication Data

US 2001/0035300 A1 Nov. 1, 2001

Related U.S. Application Data

(60) Provisional application No. 60/202,380, filed on May 4, 2000.

(51) Int. Cl.[7] ................................................. H01Q 1/36
(52) U.S. Cl. ............................... 343/700 MS; 343/895; 29/600
(58) Field of Search ......................... 343/700 MS, 895, 343/787, 788; 333/33, 246; 29/600

(56) References Cited

U.S. PATENT DOCUMENTS

| | | |
|---|---|---|
| 3,736,534 A | 5/1973 | Chaffee |
| 3,754,197 A | 8/1973 | Cristal |
| 4,095,227 A | 6/1978 | Kaloi |
| 4,786,914 A | 11/1988 | Wu et al. |
| 4,839,659 A * | 6/1989 | Stern et al. .......... 343/700 MS |
| 4,899,164 A | 2/1990 | McGrath |
| 4,914,449 A | 4/1990 | Fukuzawa et al. |
| 5,561,438 A * | 10/1996 | Nakazawa et al. .......... 343/787 |
| 5,638,080 A * | 6/1997 | Orthmann et al. .......... 343/788 |
| 5,790,080 A | 8/1998 | Apostolos |
| 5,892,490 A | 4/1999 | Asakura et al. |
| 5,903,242 A * | 5/1999 | Tsuru et al. ................. 343/788 |
| 5,936,687 A * | 8/1999 | Gudilev et al. ............. 343/702 |
| 5,977,927 A * | 11/1999 | Mandai et al. .............. 343/788 |
| 6,008,762 A | 12/1999 | Nghiem |
| 6,034,637 A | 3/2000 | McCoy et al. |
| 6,094,170 A | 7/2000 | Peng |
| 6,115,585 A * | 9/2000 | Matero et al. ............... 333/101 |

FOREIGN PATENT DOCUMENTS

| | | |
|---|---|---|
| JP | 09-069716 | 3/1997 |
| WO | WO 98/49742 | 11/1998 |

OTHER PUBLICATIONS

PCT International Search Report dated Aug. 3, 2001 of International Application No. PCT/US01/14530 filed May 4, 2001.

* cited by examiner

Primary Examiner—Tan Ho
(74) Attorney, Agent, or Firm—Scott J. Asmus; Vernon C. Maine; Maine & Asmus

(57) ABSTRACT

A meander line antenna (MLA) is fabricated by using printed circuit techniques to form a one-piece meander line. Previous MLAs so constructed required hand assembly. The present method of the invention utilizes photolithographic methods and plated through hole construction to fabricate the antenna without the need for hand assembly. A conductor trace is etched on both sides of a printed circuit board, and slotted vias are milled into the board, wherein the vias are plated through to form the continuous meander line circuit.

15 Claims, 5 Drawing Sheets

PRINTED CIRCUIT VARIABLE IMPEDANCE TRANSMISSION LINE ANTENNA

RELATED APPLICATION

Applicant hereby claims the priority benefits basing said claim on U.S. Provisional Patent application Ser. No. 60/202,380, filed May 4, 2000.

FIELD OF THE INVENTION

The present invention relates to meander line antennas and, more particularly, to a method for fabricating meander line antennas that require no manual assembly.

BACKGROUND OF THE INVENTION

In the past, efficient antennas have typically required structures with minimum dimensions on the order of a quarter wavelength of the radiating frequency. These dimensions allowed the antenna to be easily excited and to be operated at or near a resonance, limiting the energy dissipated in resistive losses and maximizing the transmitted energy. These antennas tended to be large in size at the resonant wavelength. Further, as the frequency decreased, the antenna dimensions proportionally increased. In order to address the shortcomings of traditional antenna design and functionality, researchers have developed the meander line loaded antenna (MLA).

A typical meander line loaded antenna is disclosed in U.S. Pat. No. 5,790,080, hereby incorporated by reference. An example of a meander line loaded antenna is also known as a variable impedance transmission line (VITL) antenna. The antenna consists of two vertical conductors and a horizontal conductor. The vertical and horizontal conductors are separated by gaps.

Also, part of the antenna comprises meander lines. These meander lines are connected between the vertical and horizontal conductors at the gaps, one or both of which are bridged by meander lines. The meander line is designed to adjust the electrical length of the antenna. In addition, these meander lines provide for a slow wave structure, and make possible switching lengths that can be quickly applied to and removed from the circuit with negligible loss. This switching provides a change in the effective electrical length of the antenna, and is possible because the meander line is constructed with its active switching structure always located in the high impedance sections of the meander line. This keeps the current through the device low, which results in very low dissipation losses. Thus high antenna efficiency is achieved.

The typical antenna can be operated in a loop mode that provides a "figure eight" coverage pattern. A horizontal polarization, loop mode is obtained when the antenna is operated at a frequency such that the electrical length of the entire line including the meander lines is a multiple of a full wavelength. The antenna can also be operated in a vertically polarized, monopole mode, by adjusting the electrical length to an odd multiple of a half wavelength at the operating frequency. The meander lines can be tuned using electrical or mechanical switches to change the mode of operation at a given frequency, or to switch frequency using a given mode.

The invention of the meander line loaded antenna allows the physical antenna dimensions to be significantly reduced in size, while maintaining an electrical length that maintains a multiple of a quarter wavelength. Antennas and radiating structures fabricated with this design operate in the region where the limitation on their fundamental performance is governed by the Chu-Harrington relation:

$$\text{Efficiency} = FV_2Q$$

where:
Q=Quality Factor
$V_2$ =Volume of the structure in cubic wavelengths
F=Geometric Form Factor (F=64 for a cube or a sphere)

Meander line loaded antennas achieve the efficiency limit of the Chu-Harrington relation while allowing the antenna size to be much less than a wavelength at the frequency of operation. Height reductions of 10 to 1 can be achieved over quarter wave monopole antennas, while achieving a comparable gain.

The existing MLA antennas are individually designed and are built by hand. The high labor costs of manufacturing these antennas make their use prohibitive. Unfortunately, communication applications require devices that can be made cheaply, in order that the manufacturer keeps competitive. This invention reflects the discovery of a way to mass produce VITL antennas for commodity applications, such as cell phones.

DISCUSSION OF RELATED ART

U.S. Pat. No. 5,790,080, entitled MEANDER LINE LOADED ANTENNA, assigned to Lockheed Sanders, Inc. of Nashua, N.H., describes an antenna that includes one or more conductive elements. These elements act as radiating antenna elements, and provide a slow wave meander line that is adapted to couple electrical signals between the conductive elements. The meander line has an effective physical length, which affects the electrical length and the operating characteristics of the antenna. The electrical length and operating mode of the antenna may be readily controlled.

U.S. Pat. No. 6,034,637 entitled DOUBLE RESONANT WIDE BAND PATCH ANTENNA, AND METHOD OF FORMING SAME, assigned to Motorola, Inc., of Schaumburg, Ill., describes a double resonant wide band patch antenna that includes a planar resonator forming a substantially trapezoidal shape having a non-parallel edge that provides a substantially wide bandwidth. A feed line extends parallel to the non-parallel edge for coupling, while a ground plane extends beneath the planar resonator for increasing radiation efficiency.

U.S. Pat. No. 6,008,762, entitled FOLDED QUARTER WAVE PATCH ANTENNA, assigned to QUALCOMM Incorporated of San Diego, Calif., describes a folded quarter-wave patch antenna which includes a conductor plate having first and second spaced apart arms. A ground plane is separated from the conductor plate by a dielectric substrate and is approximately parallel to the conductor plate. The ground plane is electrically connected to the first arm at one end. A signal unit is electrically coupled to the first arm. The signal unit transmits and/or receives signals having a selected frequency band. The folded quarter-wave patch antenna can also act as a dual frequency band antenna. In dual frequency band operation, the signal unit provides the antenna with a first signal comprising a first frequency band, and a second signal comprising a second frequency band.

The main difference between this inventive antenna and that of the related art is the cost saving circuit printing of the antenna meander lines. Previous meander lines were constructed of sheet metal. Printing the circuit assembly lowers costs.

The key advantages of using printed circuit board technology, are:

1) Ease of manufacturing.
2) The use of standard printed wiring board techniques.
3) The ability to manufacture small MLAs for use at microwave frequencies.
4) Increased mechanical stability.
5) Higher vibration and shock resistance.
6) Increased reliability.
7) High reproducibility.
8) No need for tuning during assembly.
9) Lower costs.

A meander line printed circuit board implementation is disclosed in U.S. Pat. No. 6,094,170 assigned to Advanced Application Technology of Taiwan. This patent describes implementing a planar array element as a meander line on the surface of a dielectric plate, according to Printed circuit board techniques that are well known in the art. Meander line generally refers to a transmission line, such as a microstrip line, that meanders or wanders in an indirect path. As described in this prior art patent, this meander line functions as a radiating element of a planar device.

However, in distinction, the geometry and overall functionality of the present invention are different. The present meander line is a different design and implementation. The whole dielectric and printed circuit board are mounted on a ground plane. Elements are on two levels, on the upper surface and on the lower surface of the printed circuit board as well as on the sides and through the plated through holes.

The present invention does not radiate, but rather performs the function of the meander line as described herein and previously implemented as shown in FIG. 2. The present invention is placed in the gap of the radiating structure of the antenna shown in FIG. 1. The present device is affixed in the gap either on the horizontal underside surface or on the inner vertical surfaces of an antenna device.

SUMMARY OF THE INVENTION

The antenna structure of this invention features a new meander line construction. The antenna structure is based on U.S. Pat. No. 5,790,080, for MEANDER LINE LOADED ANTENNA. The present invention is an extension of the teaching advanced therein. In the aforementioned patent, an antenna is described in which meander lines are fabricated using printed circuit techniques, in order to lower the overall cost of MLA antennas. The present invention uses lithographic techniques and plated through holes (vias), in conjunction with the aforesaid printed circuit board technology in order to eliminate the need for hand assembly of the fabricated components.

One object of the invention is a method of fabricating a meander line antenna using printed circuit techniques that do not require hand assembly. The method comprises the steps of fabricating a meander line as part of a meander line circuit board, including the additional steps of providing a continuous non-overlapping conductor trace for the meander line circuit on at least one surface of the circuit board. Providing vias in the meander line circuit board for said conductor trace, and integrating the meander line into at least one radiating surface of the antenna.

An object includes the method of fabricating the meander line antenna, wherein the vias provided are etched or plated through.

A further object is the method of fabricating the meander line antenna, wherein the meander line includes attaching the meander line circuit to vertical radiating elements or the horizontal radiating element of the antenna. The antenna vertical and horizontal radiating elements are separated by a gap and the meander line is connected across the gap of the vertical and horizontal radiating surfaces.

An additional object is the method of fabricating the meander line antenna, wherein the vias are etched by photo-lithographic methods or are slotted.

An object of the invention is a method of fabricating an integrated printed circuit board meander line, the method comprising the steps of providing a continuous non-overlapping conductor trace around a printed circuit board material, wherein the trace makes one or more revolutions about the board. Providing vias in the circuit board for the trace to make the revolutions, and disposing the printed circuit board material onto a dielectric base.

An object includes a method of fabricating the integrated printed circuit board meander line, further comprising a step of angling the conductor trace.

Yet a further object of the invention is an integrated printed circuit board meander line device, comprising a dielectric base, a printed circuit board material mounted to said dielectric base, a continuous non-overlapping conductor trace making one or more revolutions around the printed circuit board, wherein the conductor trace travels through one or more vias in the circuit board.

A further object is an integrated printed circuit board meander line device, wherein the conductor trace is angled in order to make the trace non-overlapping.

And, another object is an integrated printed circuit board meander line device, wherein a starting point of the trace and an ending point of the trace are located on a same side of the circuit board. This allows easier connectivity of the integrated device at the antenna.

An additional object is an integrated printed circuit board meander line device, wherein the printed circuit board material is copper cladding.

An object of the invention is a printed circuit meander line, comprising a dielectric substrate having a pair of substantially parallel opposed surfaces, with a multiplicity of printed circuit conductors formed on the opposed surfaces of the substrate. There are connector means formed around or through the substrate and serially connecting the multiplicity of printed circuit conductors to form a single continuous meander line with series connected alternating printed circuit conductors located on opposite surfaces of the substrate. A dielectric layer is mounted on one surface of the substrate over the printed circuit conductors on that surface, wherein the dielectric layer is adapted for coupling to a ground plane for locating the two surfaces of the substrate parallel to the ground plane.

An additional object, wherein the substrate has at least one edge and further wherein the connector means are printed circuit conductor sections formed on the edge. Furthermore, wherein the substrate has a second edge opposed to the one edge and further wherein the connector means are printed circuit conductors formed on the second edge.

Yet a further object wherein the printed circuit conductors formed on the opposed surfaces of the substrate are at least in partial alignment with each other.

A final object wherein the connector means are plated vias formed through the dielectric substrate between aligned printed circuit conductors located on the opposed surfaces.

BRIEF DESCRIPTION OF THE DRAWINGS

A complete understanding of the present invention may be obtained by reference to the accompanying drawings, when considered in conjunction with the subsequent detailed description, in which.

DETAILED DESCRIPTION OF THE PREFERRED EMBODIMENT

Generally speaking, a meander line antenna (MLA) is fabricated by using printed circuit techniques to form a one-piece meander line. Previous MLAs so constructed required hand assembly. The present method of the invention utilizes photolithographic methods and plated through hole construction to fabricate the antenna without the need for hand assembly. A basic copper conductor trace is etched on both sides of a printed circuit board, and slotted vias are milled into the board. The vias are then plated through to form the meander line circuit.

Figure 1:
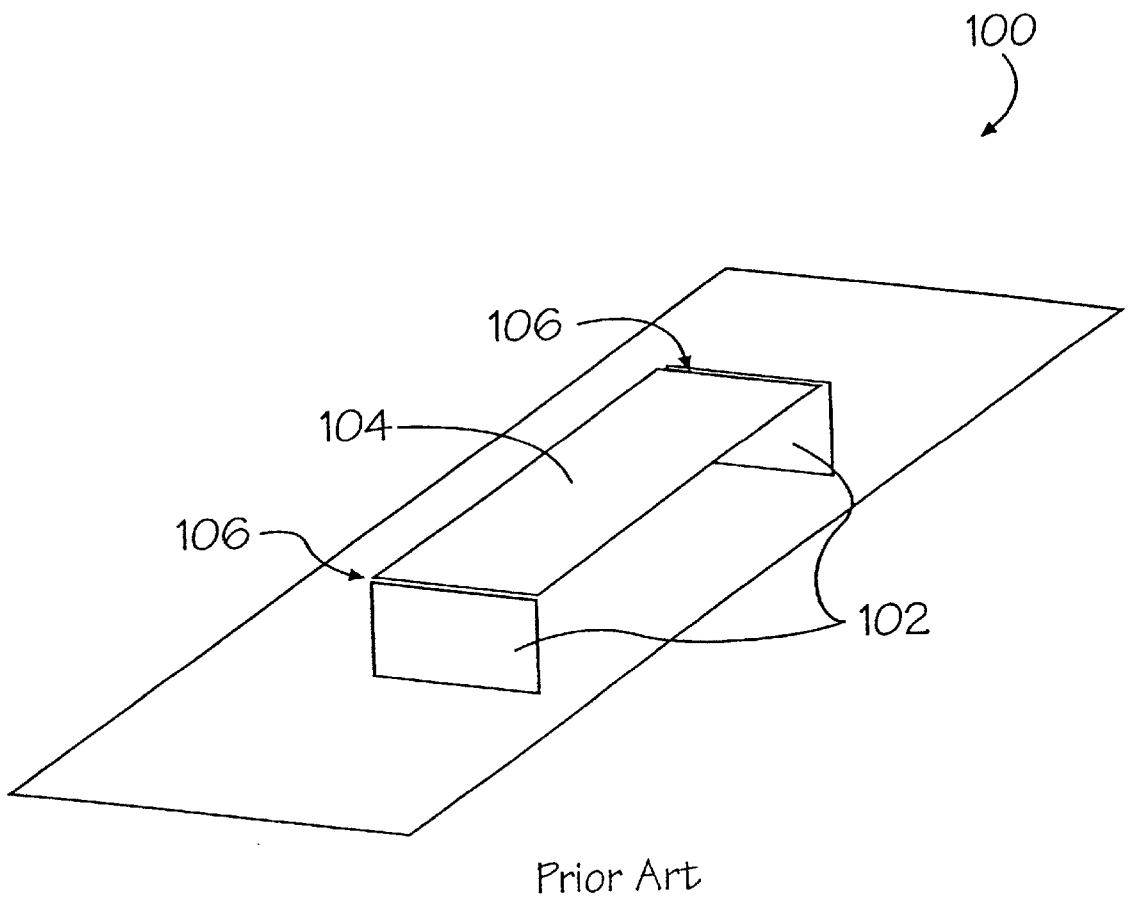
FIG. 1 illustrates a schematic, perspective view of a VITL loop (meander line) antenna of the prior art.

Referring first to FIG. 1, there is shown a simple, typical, wide band MLA of the prior art, generally represented by reference number 100. A pair of vertical elements 102 are separated from a horizontal element 104 by one or two gaps 106. Typically, either one or both of the gaps 106 are bridged by a meander line.

Figure 2:
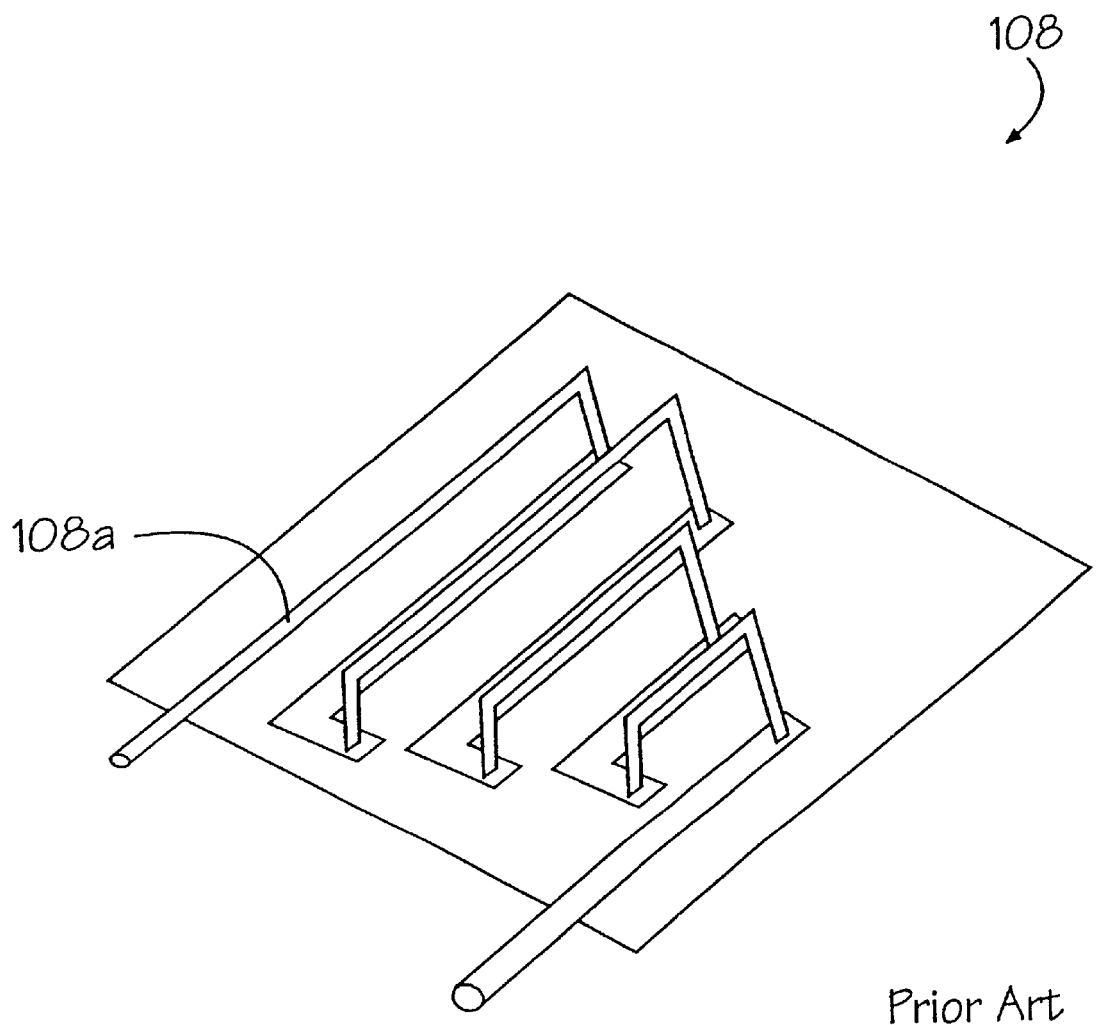
FIG. 2 depicts a schematic, perspective view of a meander line used as an element coupler in the meander line loop antenna of FIG. 1.

Referring now also to FIG. 2, there is shown generally at reference number 108 a perspective view of a meander line 108a suitable for such use.

Figure 3:
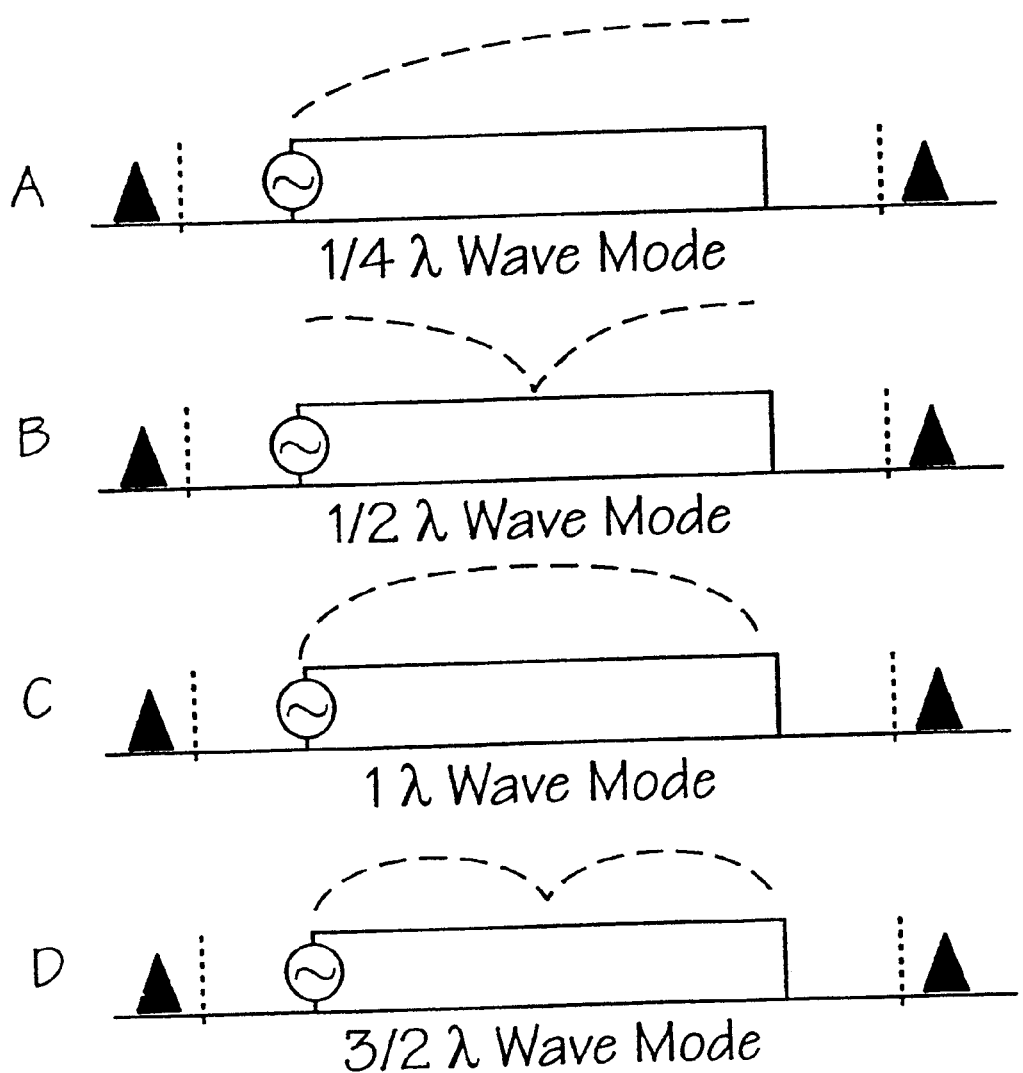
FIG. 3, consisting of a series of diagrammatic views 3A through 3D, depicts four operating modes of the antenna shown in FIGS. 1 and 2.

Referring now to FIG. 3, there are shown four typical operating modalities for the MLA 100 shown in FIG. 1 in combination with the meander line 108a (FIG. 2). Quarter wavelength, ½λ, 1λ and ³⁄₂λ modes of operation are shown.

A feature of the invention is the formation of linear arrays of crossed MLA elements that may then be arranged into a symmetrical array. A movable ground plane provides for frequency tuning of the elements. The symmetrical array so formed provides a scanning, maneuverable, phased array. The structure of the crossed MLA elements provides operation in a circular polarization mode.

The meander line is connected across the gaps between elements in FIG. 1, but can also be placed on the inside of the vertical sections or on the under side of the middle section. As currently practiced, the meander line of FIG. 2 is fabricated and assembled by hand.

Figure 4:
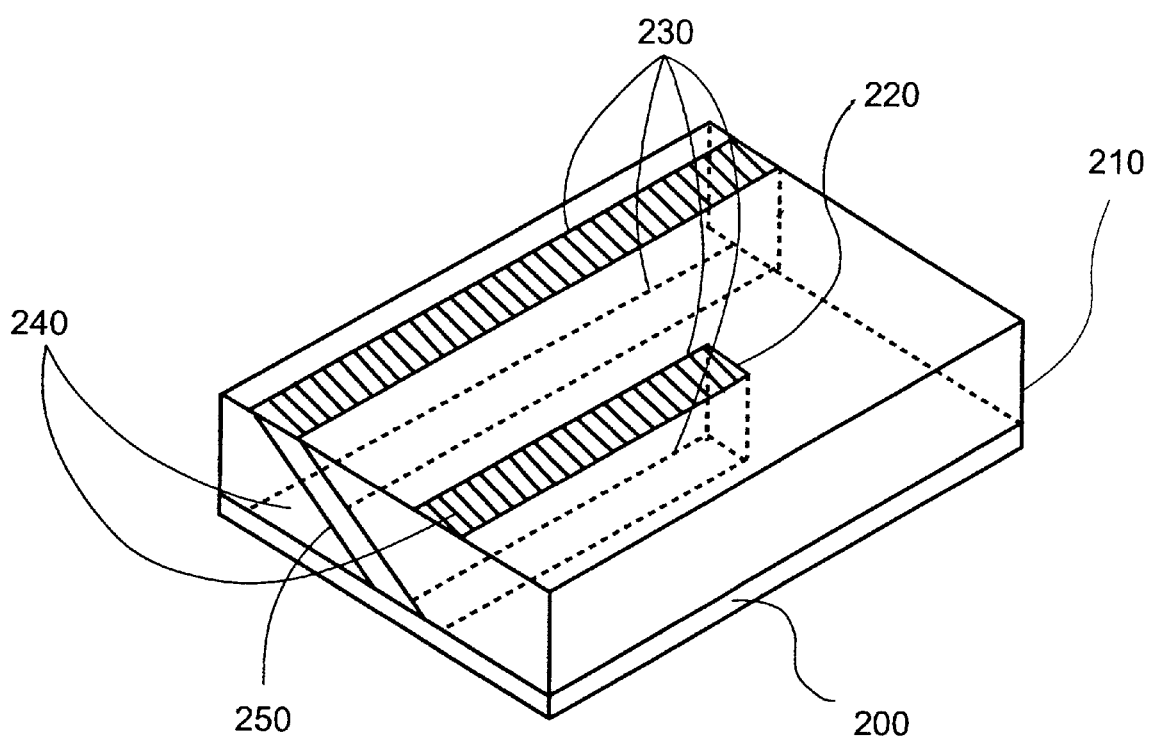
FIG. 4 shows a schematic, perspective view of the meander line construction in accordance with the method of this invention.

The present invention reflects the discovery that it is possible to use printed circuit technology to fabricate meander lines for use in the MLA without requiring hand assembly. A printed circuit meander line of the present invention is shown in FIG. 4. The use of standard printed circuit board materials in conjunction with photo-lithographic techniques and the use of plated through hole technology results in a compact, highly reproducible, and rugged, one piece meander line.

Referring to FIG. 4, a conductor trace 230 is etched on the printed circuit board 210 and slotted vias 220 are milled into the board 210 and plated through using conventional printed circuit board manufacturing techniques.

In one embodiment, the printed circuit board 210, which is generally rectangular, is 1 ounce copper cladding, and the conductor traces 230 begin on the bottom surface of the printed circuit board 210. The conductor 230 wraps around the outer side edge or the plated through via holes 220, and then across the top surface of the printed circuit board 210. In this embodiment the copper conductor 230 is angled at a side edge 250 of the printed circuit board 210 in order to continue the trace 230 in a non-overlapping fashion. The copper conductor 230 continues on the underside of the printed circuit board 210 and then up through a plated through via hole 220 to the top surface of the printed circuit board 210 and then to the outer edge. The edge connectors 240 are the meander line connections when connecting to the antenna. The length of the copper conductor trace 230 and the number of non-overlapping circular wrappings depend upon the application. This device, as created by the printed circuit board process, replicates the design of prior art FIG. 2.

Figure 5:
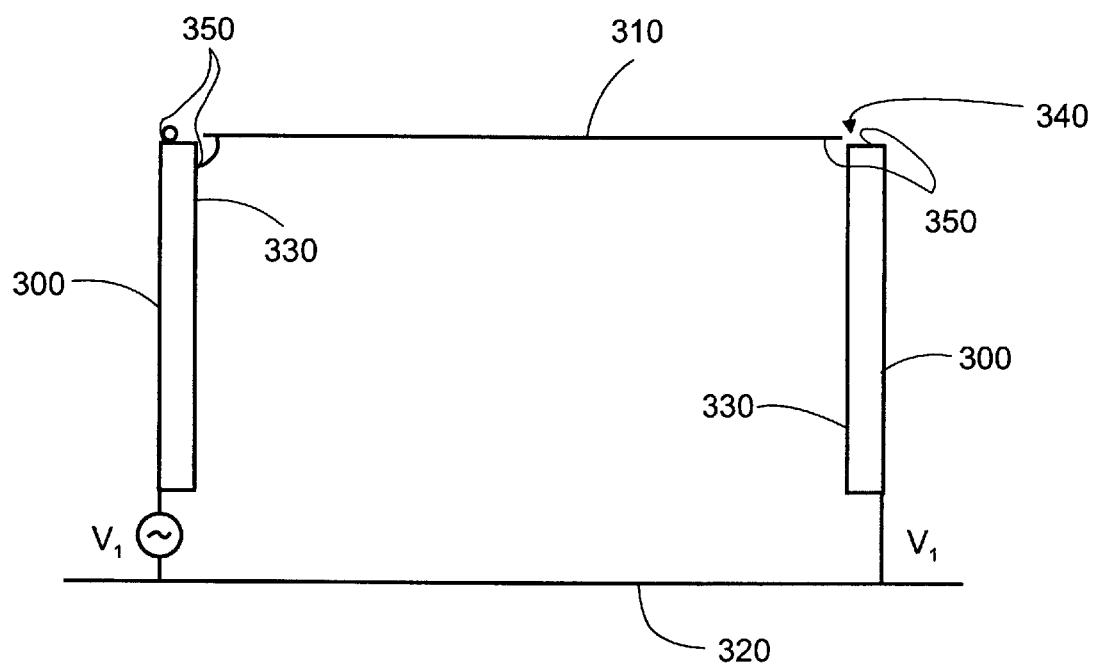
FIG. 5 illustrates a plan, diagrammatic view of the meander line circuit for the construction shown in FIG. 4.

The integrated printed circuit board meander line is easily attached to the inner structure of an MLA antenna as shown in FIG. 5. Here the printed circuit meander line 330 is shown mounted inside an MLA antenna on the vertical radiating elements 300. The ends of the meander line are connected across the gap 340 between the vertical and the horizontal radiating elements. The result is an easily manufactured MLA antenna, which requires no adjustments on the factory floor. The approach significantly reduces antenna cost and extends the upper frequency limit of operation of MLA antennas into the microwave and millimeter wave ranges.

Referring to FIG. 5, there are a pair of vertical metal members 300 extending from the ground plane 320. A horizontal metal member 310 extends across the top between the two vertical members 300 but without a direct connection. A gap 340 provides a small separation between the horizontal member 310 and the pair of vertical members 300. In this embodiment, the printed circuit board integrated meander line 330 is mounted to the inner vertical members. The meander line connections 350 connect the integrated meander line 330 to the horizontal member 310 across the gap 340. As previously discussed, the printed circuit board integrated meander line 330 could have been mounted on the underside of the horizontal member 310 instead of the vertical members. Mounting can be done in a number of different ways, including adhesives and epoxies.

The use of printed circuit technology to fabricate the meander lines and the use of plated through holes ensures good electrical conductivity at high frequencies.

Since other modifications and changes varied to fit particular operating conditions and environments or designs will be apparent to those skilled in the art, the invention is not considered limited to the examples chosen for purposes of disclosure, and covers changes and modifications which do not constitute departures from the true scope of this invention.

Having thus described the invention, what is desired to be protected by letters patents is presented in the subsequently appended claims.

What is claimed is:

1. A method of fabricating a meander line antenna having at least one radiating element, and at least one meander line fabricated using printed circuit techniques that do not require hand assembly, the method comprising the steps of:
   i) providing a meander line printed circuit board;
   ii) forming a continuous non-overlapping conductor trace on at least one surface of said meander line printed circuit board, thereby forming said meander line;

iii) providing vias in the meander line printed circuit board for said conductor trace; and iv) coupling said at least one meander line to each of said at least one radiating element.

2. The method of fabricating said meander line antenna in accordance with claim 1, wherein said vias are etched.

3. The method of fabricating said meander line antenna in accordance with claim 1, wherein said vias are plated through.

4. The method of fabricating said meander line antenna in accordance with claim 1, wherein one said radiating element is substantially vertical.

5. The method of fabricating said meander line antenna in accordance with claim 1, wherein one said radiating element is substantially horizontal.

6. The method of fabricating said meander line antenna in accordance with claim 1, wherein said meander line antenna has a substantially vertical and a substantially horizontal radiating element.

7. The method of fabricating said meander line antenna in accordance with claim 6, wherein said vertical and horizontal radiating element are separated by a gap and said meander line is connected across said gap.

8. The method of fabricating said meander line antenna in accordance with claim 1, wherein said vias are etched by photo-lithographic methods.

9. The method of fabricating said meander line antenna in accordance with claim 1, wherein said vias are slotted.

10. A method of fabricating an integrated printed circuit board meander line, the method comprising the steps of:

i) forming a continuous non-overlapping conductor trace around a printed circuit board material, wherein said trace makes one or more revolutions about said board;

ii) providing vias in said circuit board for said trace to make said revolutions;

iii) forming said traces on at least one edge of said circuit board to make said revolutions; and iv) disposing said printed circuit board material onto a dielectric base.

11. A method of fabricating an integrated printed circuit board meander line according to claim 10, further comprising a step of angling said conductor trace.

12. A printed circuit meander line, comprising:

a dielectric substrate having a pair of substantially parallel opposed surfaces and at least one edge section;

a multiplicity of printed circuit conductors formed on the opposed surfaces of the substrate;

connector means serially connecting the multiplicity of printed circuit conductors to form a single continuous meander line with series connected alternating printed circuit conductors located on opposite surfaces of the substrate, wherein said connector means include printed circuit conductors formed on said at least one edge section; and a dielectric layer mounted on one surface of the substrate over the printed circuit conductors on that surface.

13. The meander line of claim 12, wherein the substrate has a second edge opposed to said at least one edge and further wherein said connector means are printed circuit conductors formed on the second edge.

14. The meander line of claim 12, wherein the printed circuit conductors formed on the opposed surfaces of the substrate are at least in partial alignment with each other.

15. The meander line of claim 14, wherein the connector means are plated vias formed through the dielectric substrate between said printed circuit conductors.

* * * * *